(12) United States Patent
Aida

(10) Patent No.: US 9,437,477 B1
(45) Date of Patent: Sep. 6, 2016

(54) PATTERN FORMING METHOD

(71) Applicant: KABUSHIKI KAISHA TOSHIBA, Minato-ku (JP)

(72) Inventor: Makoto Aida, Yatomi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/844,152

(22) Filed: Sep. 3, 2015

(30) Foreign Application Priority Data

Mar. 31, 2015 (JP) ................................. 2015-073718

(51) Int. Cl.
| | |
|---|---|
| H01L 21/033 | (2006.01) |
| H01L 21/768 | (2006.01) |
| H01L 21/311 | (2006.01) |
| H01L 21/266 | (2006.01) |
| G03F 7/00 | (2006.01) |
| G03F 7/20 | (2006.01) |
| G03F 7/32 | (2006.01) |

(52) U.S. Cl.
CPC ........... *H01L 21/768* (2013.01); *G03F 7/0035* (2013.01); *G03F 7/20* (2013.01); *G03F 7/32* (2013.01); *H01L 21/0337* (2013.01); *H01L 21/266* (2013.01); *H01L 21/31111* (2013.01); *H01L 21/31144* (2013.01)

(58) Field of Classification Search
CPC .................. H01L 21/02225; H01L 21/02227; H01L 21/02345; H01L 21/02365; H01L 21/02518; H01L 21/31127
See application file for complete search history.

(56) References Cited

U.S. PATENT DOCUMENTS

| | | | |
|---|---|---|---|
| 7,972,654 | B2 | 7/2011 | Nakamura |
| 2008/0254215 | A1 | 10/2008 | Nakamura |

FOREIGN PATENT DOCUMENTS

| | | |
|---|---|---|
| JP | 05-158245 | 6/1993 |
| JP | 2008-114195 | 5/2008 |
| JP | 2008-149283 | 7/2008 |
| JP | 2009-283713 | 12/2009 |

*Primary Examiner* — Cheung Lee
(74) *Attorney, Agent, or Firm* — Oblon, McClelland, Maier & Neustadt, L.L.P.

(57) ABSTRACT

In one embodiment, a pattern forming method includes forming a first film on a substrate that includes a convex portion and a concave portion so as to expose an upper end of the convex portion. The method further includes forming a photosensitive second film on the first film so as to cover the upper end of the convex portion. The method further includes exposing the second film to light. The method further includes developing the second film with a development liquid to form a second pattern of the second film. The method further includes dissolving and removing the first film exposed from the second pattern with a liquid to form a first pattern of the first film.

20 Claims, 10 Drawing Sheets

PATTERN FORMING METHOD

CROSS REFERENCE TO RELATED APPLICATION

This application is based upon and claims the benefit of priority from the prior Japanese Patent Application No. 2015-73718, filed on Mar. 31, 2015, the entire contents of which are incorporated herein by reference.

FIELD

Embodiments described herein relate to a pattern forming method.

BACKGROUND

When a photoresist coating film is formed on a substrate having a concave portion such as a trench or a hole, it becomes difficult to form a suitable coating film as the concave portion becomes deeper. For example, when a coating liquid of low concentration is used, it is difficult to make the surface of the coating film flat. On the other hand, when a coating liquid of high concentration is used, there is a possibility that the coating film with a gap is formed in the concave portion. In these cases, there is a problem that a suitable resist pattern cannot be formed of the photoresist coating film.

Moreover, when this resist film is used as a mask to implant ions into the substrate at the bottom of the concave portion, it is necessary to remove the resist film in the concave portion to form the resist pattern. In this case, it is necessary to sufficiently develop the resist film in the vicinity of the bottom of the concave portion and remove it. However, when the concave portion is deep, there is a possibility that the resist film in the vicinity of the bottom of the concave portion is not sufficiently developed and the resist film is left at the bottom of the concave portion. Therefore, there is a problem even in this case that a suitable resist pattern cannot be formed.

BRIEF DESCRIPTION OF THE DRAWINGS

FIGS. 1A to 2B are sectional views illustrating a pattern forming method of a first embodiment;

FIGS. 3A to 4B are sectional views illustrating a pattern forming method of a comparative example of the first embodiment;

FIGS. 8A to 9B are sectional views illustrating a pattern forming method of a third embodiment.

DETAILED DESCRIPTION

Embodiments will now be explained with reference to the accompanying drawings.

In one embodiment, a pattern forming method includes forming a first film on a substrate that includes a convex portion and a concave portion so as to expose an upper end of the convex portion. The method further includes forming a photosensitive second film on the first film so as to cover the upper end of the convex portion. The method further includes exposing the second film to light. The method further includes developing the second film with a development liquid to form a second pattern of the second film. The method further includes dissolving and removing the first film exposed from the second pattern with a liquid to form a first pattern of the first film.

First Embodiment

FIGS. 1A to 2B are sectional views illustrating a pattern forming method of a first embodiment.

Figure 1A:
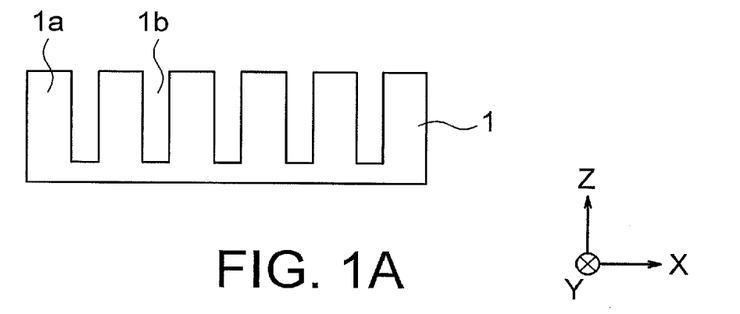

First, a substrate 1 having one or more convex portions 1a and one or more concave portions 1b is formed (FIG. 1A). An example of the substrate 1 is a process target substrate that includes a semiconductor substrate and one or more process target layers formed on the semiconductor substrate. An example of the concave portions 1b is trenches or holes that are formed on the substrate 1. The height of the convex portions 1a and the depth of the concave portions 1b in the present embodiment are set to a larger value as compared with the width of the convex portions 1a and the width of the concave portions 1b.

FIG. 1A illustrates X and Y directions that are parallel to a main surface of the substrate 1 and perpendicular to each other, and a Z direction that is perpendicular to the main surface of the substrate 1. In this specification, the +Z direction is treated as the upper direction and the −Z direction is treated as the lower direction. The −Z direction in the present embodiment may correspond to the gravity direction or may not correspond to the gravity direction.

The substrate 1 of the present embodiment may have the convex portions 1a and the concave portions 1b of any shapes. For example, the substrate 1 may have convex portions 1a that linearly extend in the Y direction and concave portions 1b that linearly extend in the Y direction. For example, the substrate 1 may have convex portions 1a that have rod shapes and extend in the Z direction, and a concave portion 1b that surrounds these convex portions 1a. In this case, FIG. 1A illustrates plural portions of the concave portion 1b. For example, the substrate 1 may have concave portions 1b that have cylinder shapes and extend in the Z direction, and a convex portion 1a that surrounds these concave portions 1b. In this case, FIG. 1A illustrates plural portions of the convex portion 1a.

Figure 1B:
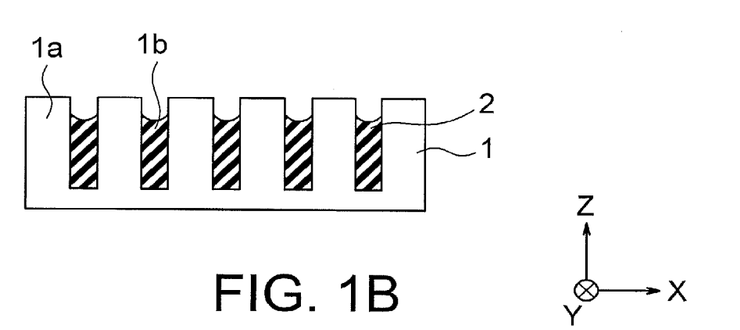

Next, a coating film 2 is formed on the substrate 1 by spin coating (FIG. 1B). Specifically, the coating film 2 is formed by dripping a coating liquid from a nozzle to the center of the substrate 1, rotating the substrate 1 and thereafter solidifying the coating liquid by bake processing of the substrate 1. The coating film 2 of the present embodiment is formed in the concave portions 1b such that the upper ends (upper surfaces) of the convex portions 1a are exposed. The coating film 2 is an example of a first film. Hereafter, the coating liquid for the coating film 2 is called a first coating liquid.

The first coating liquid of the present embodiment contains a water-soluble resin. Therefore, the coating film 2 is a water-soluble resin. It is desirable that the solubility of the coating film 2 with respect to water is high. Moreover, the first coating liquid of the present embodiment has a low viscosity. It is desirable that the first coating liquid has a lower viscosity than a second coating liquid (coating liquid for a photoresist film 3) described later. The viscosity of the first coating liquid of the present embodiment is 4 cP (centipoise) or less, for example, 2 to 3 cP. In the present embodiment, it becomes possible, by using the first coating liquid of low viscosity, to suppress that the first coating liquid is left on the upper surfaces of the convex portions 1a and gaps are left in the concave portions 1b. The coating film 2 of the present embodiment is non-photosensitive unlike the photoresist film 3 described later. The viscosity of the first coating liquid of the present embodiment is an example of a first viscosity.

Figure 1C:
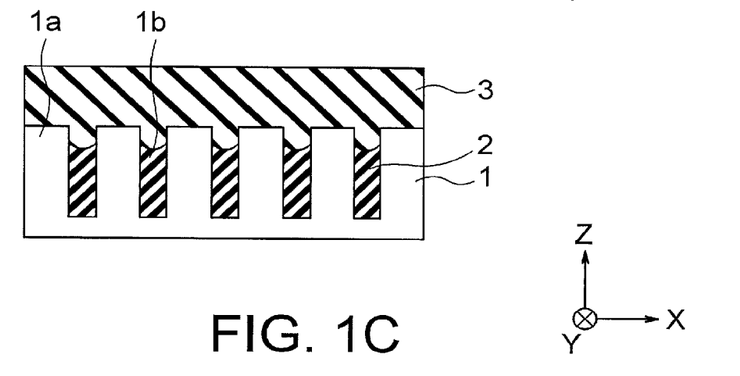

Next, the photoresist film 3 is formed on the substrate 1 through the coating film 2 by spin coating (FIG. 1C). Specifically, the photoresist film 3 is formed by dripping a coating liquid from a nozzle to the center of the substrate 1, rotating the substrate 1 and thereafter solidifying the coating liquid by bake processing of the substrate 1. The photoresist film 3 of the present embodiment is formed in the concave portions 1b and on the convex portions 1a so as to cover the upper ends (upper surfaces) of the convex portions 1a. The photoresist film 3 is an example of a photosensitive second film. Hereafter, the coating liquid for the photoresist film 3 is called a second coating liquid.

The second coating liquid of the present embodiment has a higher viscosity than the first coating liquid. The viscosity of the second coating liquid of the present embodiment is more than 4 cP, for example, 10 to 100 cP. The viscosity of the second coating liquid of the present embodiment is an example of a second viscosity. The photoresist film 3 of the present embodiment is a positive type, but it may be a negative type.

Figure 2A:
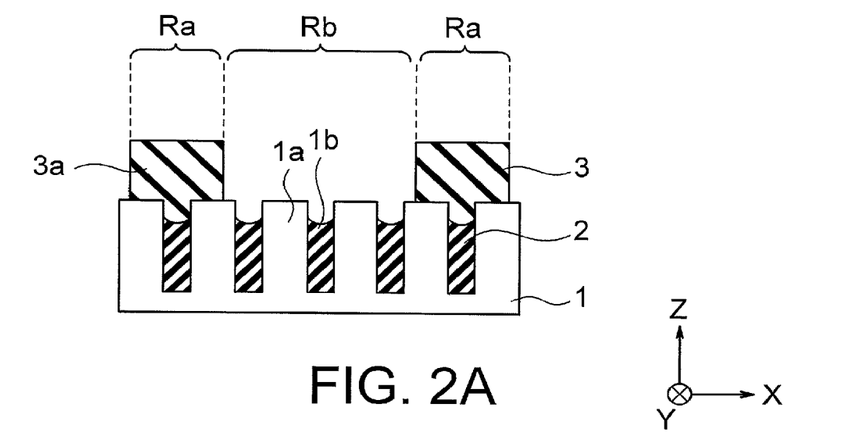

Next, the photoresist film 3 is exposed to light from an exposure apparatus (FIG. 2A). Reference characters Ra and Rb designate first and second regions on the substrate 1. In the present embodiment, the photoresist film 3 in the second regions Rb is exposed to the light. Bake processing of the substrate 1 is then performed.

Next, the photoresist film 3 is developed with a development liquid (FIG. 2A). By this means, the photoresist film 3 in the second regions Rb is dissolved and removed by the development liquid. As a result, resist patterns 3a are formed of the photoresist film 3 in the first regions Ra. The development liquid of the present embodiment is a TMAH (tetramethylammonium hydroxide) solution with concentration of 2.38%. The resist patterns 3a are an example of a second pattern.

Figure 2B:
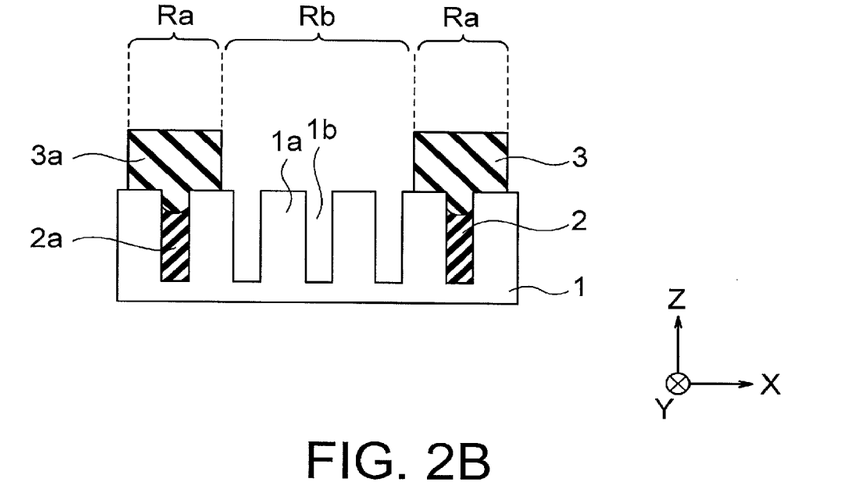

When the photoresist film 3 in the second regions Rb is dissolved and removed, the coating film 2 in the second regions Rb is exposed from the photoresist film 3. As a result, the coating film 2 in the second regions Rb is exposed to the development liquid. Since the coating film 2 of the present embodiment is water-soluble, it dissolves in the development liquid. Therefore, when the photoresist film 3 in the second regions Rb is dissolved and removed by the development liquid, the coating film 2 in the second regions Rb is dissolved and removed by this development liquid too (FIG. 2B). On the other hand, since the coating film 2 in the first regions Ra is covered with the resist patterns 3a, it is not exposed to the development liquid and therefore is not dissolved and removed by the development liquid. As a result, coating film patterns 2a are formed of the coating film 2 in the first regions Ra. The coating film patterns 2a are an example of a first pattern.

In this way, it is possible to form the coating film patterns 2a and the resist patterns 3a in which the concave portions 1b in the first regions Ra are covered and the concave portions 1b in the second regions Rb are exposed. For example, these patterns 2a and 3a can be used as a mask to implant ions into the substrate 1 at the bottoms of the concave portions 1b in the second regions Rb. Specific examples of such processing are described later.

FIGS. 3A to 4B are sectional views illustrating a pattern forming method of a comparative example of the first embodiment.

Figure 3A:
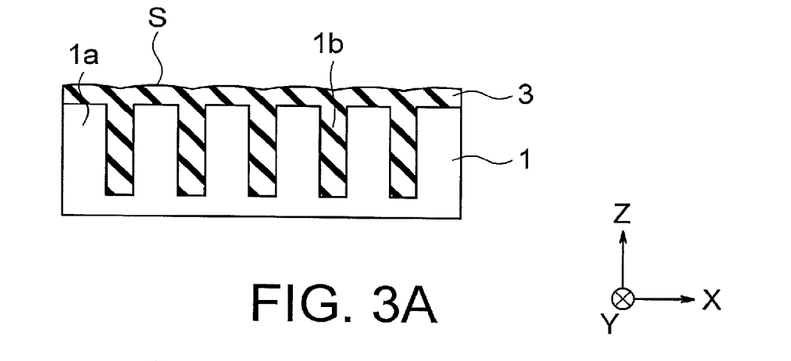
Figure 3B:
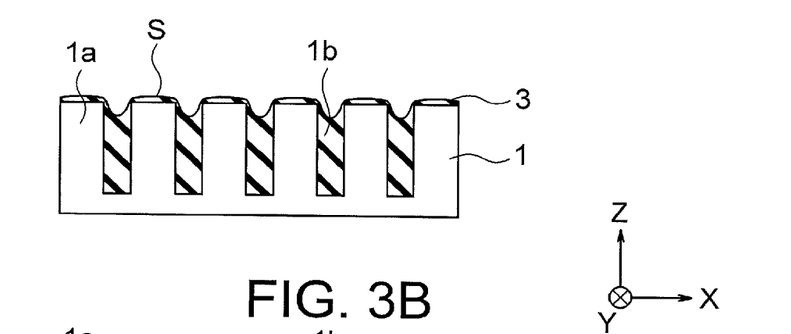
Figure 3C:
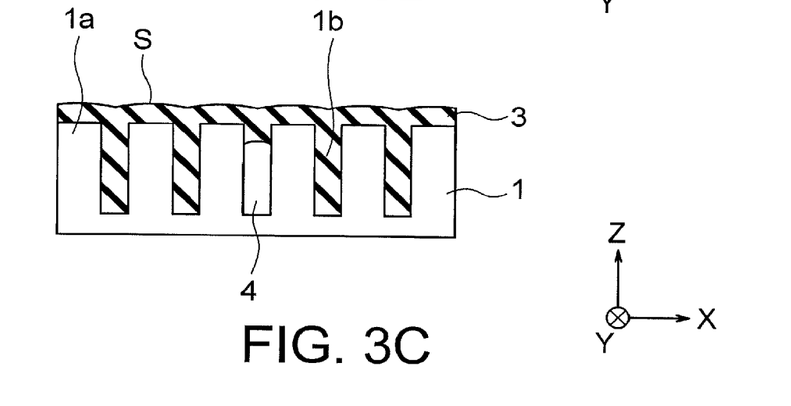

FIG. 3A illustrates the photoresist film 3 directly formed on the substrate 1 by spin coating. In this case, when the second coating liquid of low concentration is used, it is difficult to make a surface S of the photoresist film 3 flat (FIG. 3B). On the other hand, when the second coating liquid of high concentration is used, there is a possibility that the photoresist film 3 with a gap 4 in a concave portion 1b is formed (FIG. 3C).

Figure 4A:
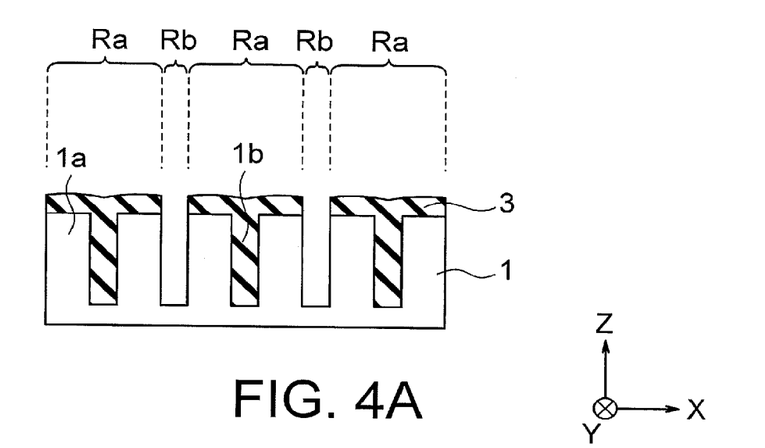
Figure 4B:
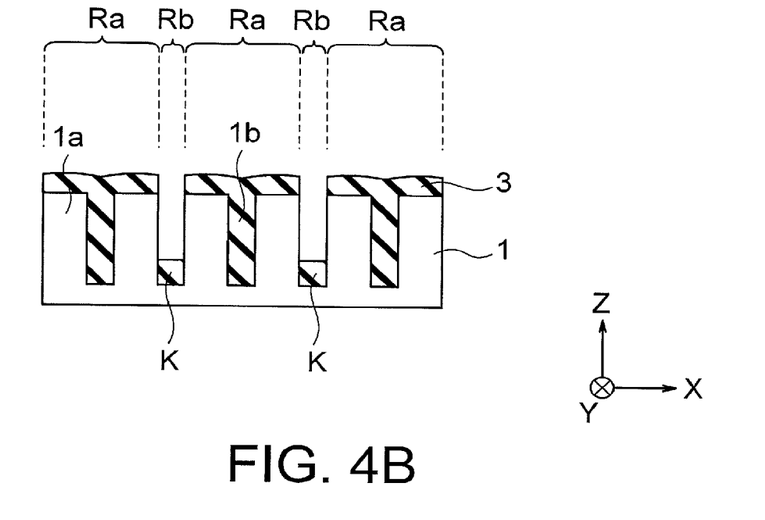

In FIG. 4A, the photoresist film 3 in the second regions Rb is removed by exposing the photoresist film 3 with light and developing the photoresist film 3. In this case, it is necessary to sufficiently develop and remove the photoresist film 3 in the vicinity of the bottoms of the concave portions 1b in the second regions Rb. However, when the concave portions 1b are deep, the photoresist film 3 in the vicinity of the bottoms of the concave portions 1b is not sufficiently developed, and there is a possibility that the photoresist film 3 is left in the bottoms of the concave portions 1b (FIG. 4B). Reference character K designates the residue of the photoresist film 3 that is left at the bottoms of the concave portions 1b.

On the other hand, the photoresist film 3 is formed on the substrate 1 through the coating film 2 in the present embodiment. Therefore, the present embodiment makes it possible, for example, to suppress the generation of the gap 4 by using the coating film 2 of low viscosity. Moreover, according to the present embodiment, it is possible to suppress the convexo-concave of the surface S of the photoresist film 3 by partially embedding the concave portions 1b by the coating film 2 and thereafter embedding the photoresist film 3 in the concave portions 1b. Moreover, according to the present embodiment, since the coating film 2 in the vicinity of the bottoms of the concave portions 1b need not be exposed, it becomes possible to suppress the generation of the residues K at the bottoms of the concave portions 1b.

In this way, according to the present embodiment, it becomes possible to form the suitable patterns 2a and 3a in which the gap 4, the convexo-concave of the surface S, the residues K and the like are suppressed, on the substrate 1 that has the concave portion 1b. By this means, it becomes possible to reduce the defect of a semiconductor device and reduce the concentration of the photoresist coating liquid. Since the photoresist coating liquid of high concentration is expensive in general, the present embodiment can reduce the manufacturing cost of the semiconductor device by reducing the cost of the photoresist coating liquid.

Figure 5A:
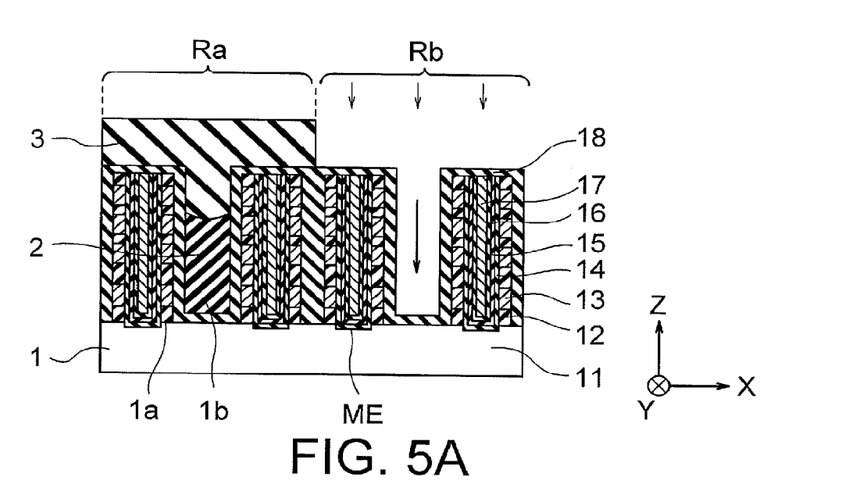
FIGS. 5A to 5C are sectional views illustrating a pattern forming method of a modification of the first embodiment.
Figure 5B:
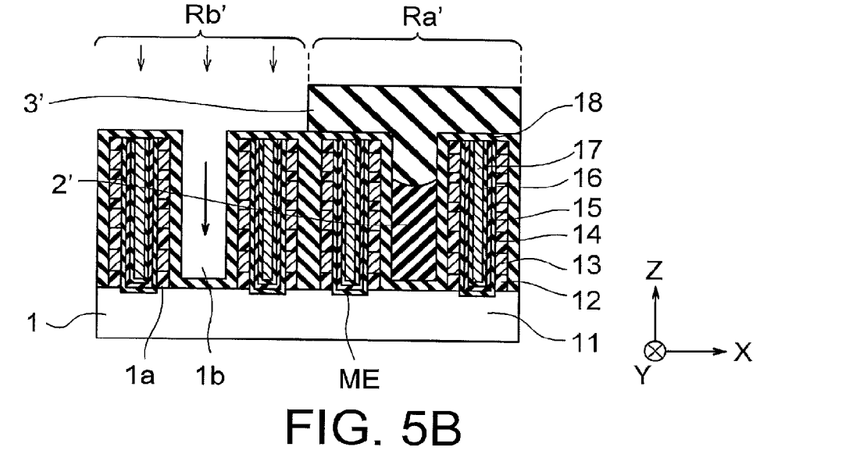
Figure 5C:
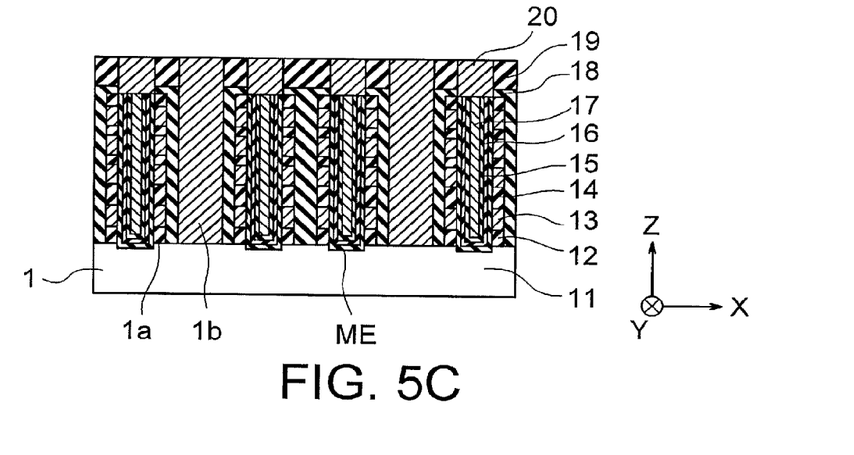

FIGS. 5A to 5C are sectional views illustrating a pattern forming method of a modification of the first embodiment.

FIG. 5A illustrates an example of the substrate 1. The substrate 1 of FIG. 5A includes a ground substrate 11, insulating layers 12 and interconnect layers 13. The substrate 1 in FIG. 5A further includes a first memory insulator 14, a charge storing layer 15, a second memory insulator 16 and a channel semiconductor layer 17 of each three-dimensional memory element ME. The substrate 1 in FIG. 5A further includes an insulator 18 that covers three-dimensional memory elements ME.

Each convex portion is of the substrate 1 is formed with the insulating layers 12, the interconnect layers 13, the first memory insulator 14, the charge storing layer 15, the second memory insulator 16, the channel semiconductor layer 17 and the insulator 18. The insulating layers 12 and the interconnect layers 13 are alternately stacked on the ground substrate 11. The first memory insulator 14, the charge storing layer 15, the second memory insulator 16 and the channel semiconductor layer 17 are sequentially formed on the side surfaces of the insulating layers 12 and the interconnect layers 13.

FIG. 5A illustrates the coating film 2 and the photoresist film 3 that are patterned such that the concave portion 1b in the first region Ra is covered and the concave portion 1b in the second region Rb is exposed. In this modification, N-type impurity ions are implanted in the substrate 1 at the bottom of the concave portion 1b in the second region Rb by using the coating film 2 and the photoresist film 3 as a mask (FIG. 5A).

FIG. 5B illustrates a coating film 2' and a photoresist film 3' that are patterned such that the concave portion 1b in a third region Ra' is covered and the concave portion 1b in a fourth region Rb' is exposed. The coating film 2' and the photoresist film 3' can be formed by processing similar to the coating film 2 and the photoresist film 3. The third and fourth regions Ra' and Rb' may be the second and first regions Rb and Ra or may be different from the second and first regions Rb and Ra, respectively. In this modification, P-type impurity ions are implanted in the substrate 1 at the bottoms of the concave portions 1b of the fourth region Rb' by using the coating film 2' and the photoresist film 3' as a mask (FIG. 5B).

In this modification, an inter layer dielectric 19 is formed on the entire surface of the substrate 1, openings are formed in the inter layer dielectric 19 and plug interconnects 20 are formed in the openings (FIG. 5C). FIG. 5C illustrates the plug interconnects 20 electrically connected with the substrate 1 at the bottoms of the concave portions 1b and the plug interconnects 20 electrically connected with the channel semiconductor layers 17. In this modification, the N-type and P-type impurity ions are activated by annealing the substrate 1 after the processes in FIGS. 5A and 5B. As a result, the N-type and P-type diffusion layers are formed in the substrate 1 at the bottoms of the concave portions 1b.

Figure 6:
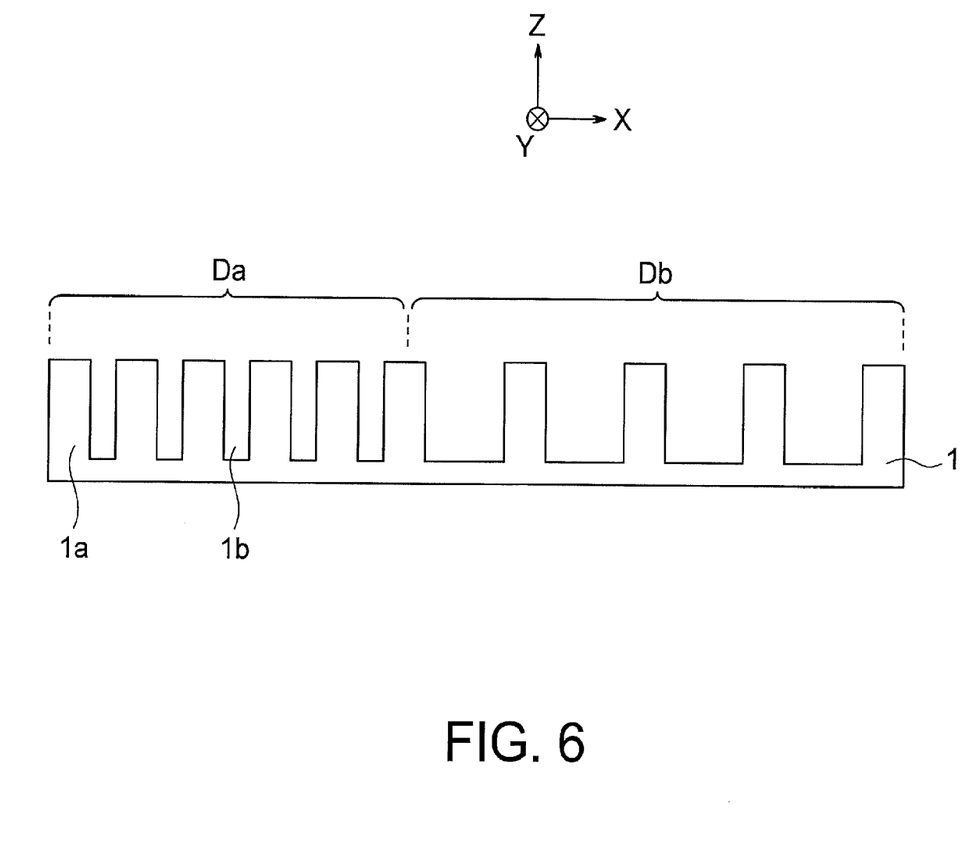
FIG. 6 is a sectional view illustrating a pattern forming method of a modification of the first embodiment.

FIG. 6 is a sectional view illustrating a pattern forming method of a modification of the first embodiment.

FIG. 6 illustrates another example of the substrate 1. The substrate 1 in FIG. 6 includes a region Da in which the convex portions 1a and the concave portions 1b are provided at a high density, and a region Db in which the convex portions 1a and the concave portions 1b are provided at a low density. The pattern forming method of the present embodiment is also applicable to such the substrate 1. Examples of the regions Da and Db are a memory cell region and peripheral circuit region of an NAND flash memory.

As mentioned above, the photoresist film 3 in the present embodiment is formed on the substrate 1 having the concave portions 1b through the coating film 2. In the present embodiment, the photoresist film 3 is exposed to the light, the resist patterns 3a are formed by developing the photoresist film 3, and the coating film patterns 2a are formed by dissolving and removing the coating film 2. By this means, the present embodiment makes it possible to form the suitable patterns 2a and 3a on the substrate 1 that has the concave portions 1b.

Second Embodiment

Figure 7A:
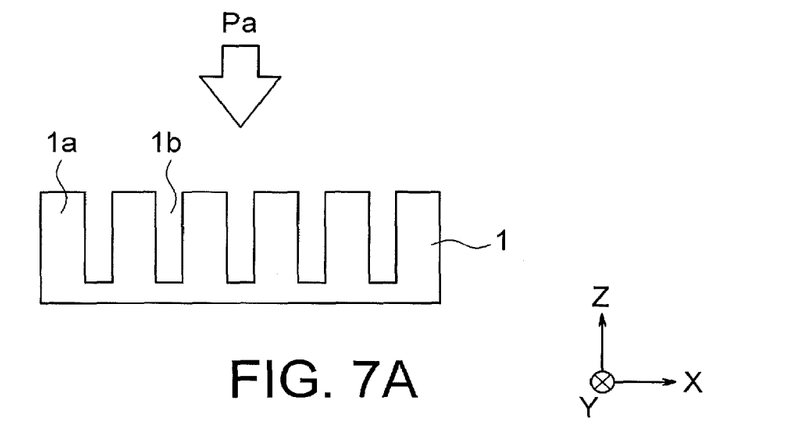
FIGS. 7A and 7B are sectional views illustrating a pattern forming method of a second embodiment.
Figure 7B:
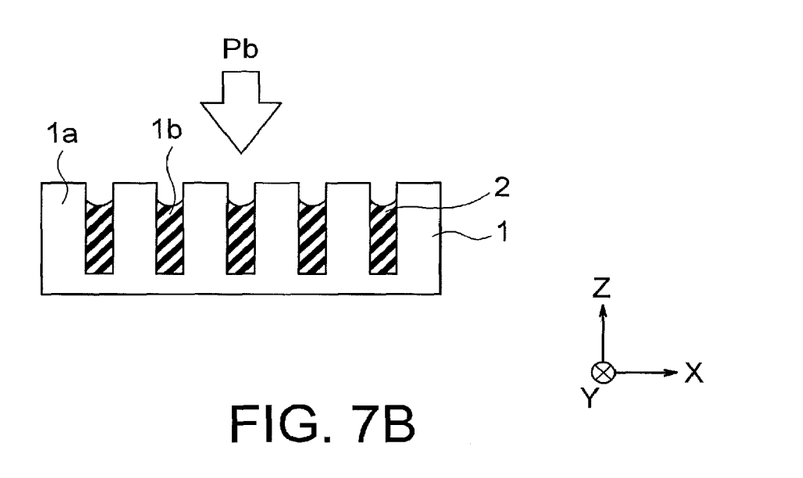

FIGS. 7A and 7B are sectional views illustrating a pattern forming method of a second embodiment.

First, the substrate 1 is formed similarly to that of the first embodiment (FIG. 7A). Next, the surface of the substrate 1 is hydrophilized before the coating film 2 is formed on the substrate 1. Reference character Pa in FIG. 7A schematically designates hydrophilization processing of the surface of the substrate 1.

Next, the coating film 2 is formed on the substrate 1 by spin coating (FIG. 7B). Specifically, the coating film 2 is formed by dripping the first coating liquid onto the substrate 1, rotating the substrate 1 and thereafter solidifying the first coating liquid by bake processing of the substrate 1.

The solvent of the first coating liquid of the present embodiment is water. Therefore, the wettability of the first coating liquid with respect to the substrate 1 can be improved by the above-mentioned hydrophilization processing. According to the present embodiment, it is possible to realize the excellent coatability of the coating film 2 by the hydrophilization processing.

Next, the surfaces of the substrate 1 and the coating film 2 are hydrophobized before the photoresist film 3 is formed on the substrate 1. Reference character Pb in FIG. 7B schematically illustrates hydrophobization processing of the surface of the substrate 1 and the coating film 2. For example, the hydrophobization processing is performed using HMDS (hexamethyldisilazane).

The processes in FIGS. 1C to 2B are then performed in the present embodiment. For example, the photoresist film 3 is formed by dripping the second coating liquid onto the substrate 1, rotating the substrate 1 and thereafter solidifying the second coating liquid by bake processing of the substrate 1.

The solvent of the second coating liquid of the present embodiment is an organic solvent as well as a coating liquid for a general photoresist film. Therefore, the wettability of the second coating liquid with respect to the substrate 1 and the coating film 2 can be improved by the above-mentioned hydrophobization processing. According to the present embodiment, it is possible to realize the excellent adhesion of the photoresist film 3 by the hydrophobization processing.

As mentioned above, the present embodiment makes it possible to form the suitable coating film 2 and photoresist film 3 by the hydrophilization processing and the hydrophobization processing.

Third Embodiment

FIGS. 8A to 9B are sectional views illustrating a pattern forming method of a third embodiment. In the present embodiment, first and second photoresist films 5 and 6 are used instead of the coating film 2 and the photoresist film 3.

Figure 8A:
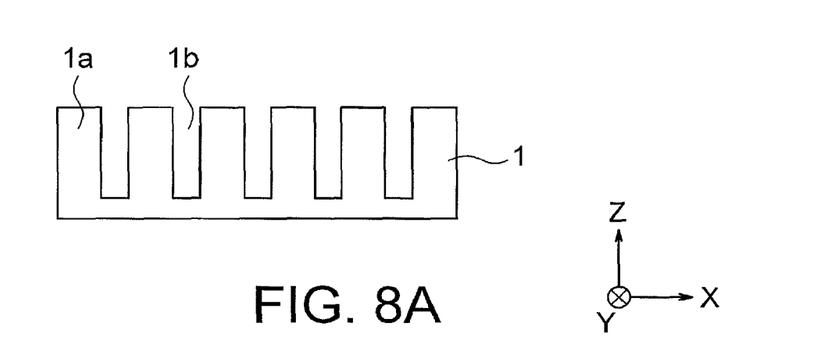

First, the substrate 1 is formed similarly to that of the first embodiment (FIG. 8A).

Figure 8B:
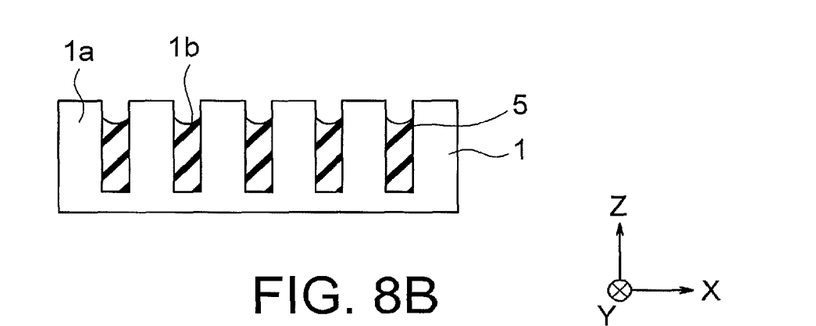

Next, the first photoresist film 5 is formed on the substrate 1 by spin coating (FIG. 8B). Specifically, the first photoresist film 5 is formed by dripping a coating liquid from a nozzle to the center of the substrate 1, rotating the substrate 1 and thereafter solidifying the coating liquid by bake processing of the substrate 1. The first photoresist film 5 of the present embodiment is formed in the concave portions 1b such that the upper ends of the convex portions 1a are exposed. The first photoresist film 5 is an example of a first photosensitive film. Hereafter, the coating liquid for the first photoresist film 5 is called a first coating liquid.

The first coating liquid of the present embodiment has a low viscosity. It is desirable that the first coating liquid has a lower viscosity than a second coating liquid (a coating liquid for the second photoresist film 6) described later. The viscosity of the first coating liquid of the present embodiment is 4 cP or less, for example, 2 to 3 cP. In the present embodiment, it becomes possible, by using the first coating liquid of low viscosity, to suppress that the first coating liquid is left on the upper surfaces of the convex portions 1a and gaps are left in the concave portions 1b. The viscosity of the first coating liquid of the present embodiment is an example of a first viscosity. It is desirable that the solubility with respect to water of the first photoresist film 5 of the present embodiment is high. Moreover, the first photoresist film 5 of the present embodiment may be either the positive type or the negative type.

Figure 8C:
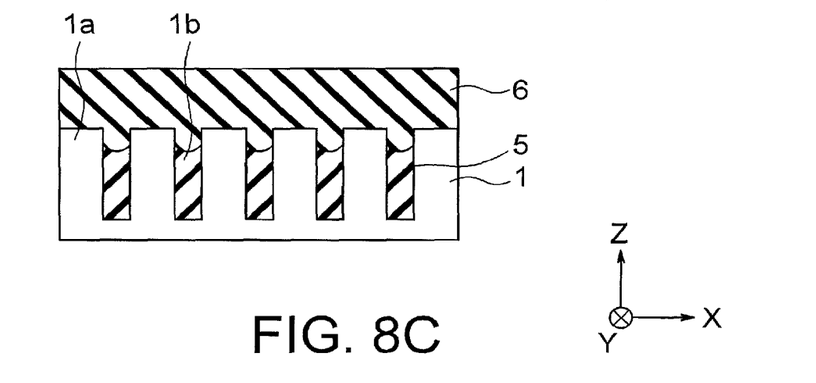

Next, the second photoresist film 6 is formed on the substrate 1 through the first photoresist film 5 by spin coating (FIG. 8C). Specifically, the second photoresist film 6 is formed by dripping a coating liquid from a nozzle to the center of the substrate 1, rotating the substrate 1 and thereafter solidifying the coating liquid by bake processing of the substrate 1. The second photoresist film 6 of the present embodiment is formed in the concave portions 1b and on the convex portions 1a so as to cover the upper ends of the convex portions 1a. The second photoresist film 6 is an example of a second photosensitive film. Hereafter, the coating liquid for the second photoresist film 6 is called a second coating liquid.

The second coating liquid of the present embodiment has a higher viscosity than the first coating liquid. The viscosity of the second coating liquid of the present embodiment is more than 4 cP, for example, 10 to 100 cP. The viscosity of the second coating liquid of the present embodiment is an example of a second viscosity. The second photoresist film 6 of the present embodiment is a positive type, but it may be a negative type.

Figure 9A:
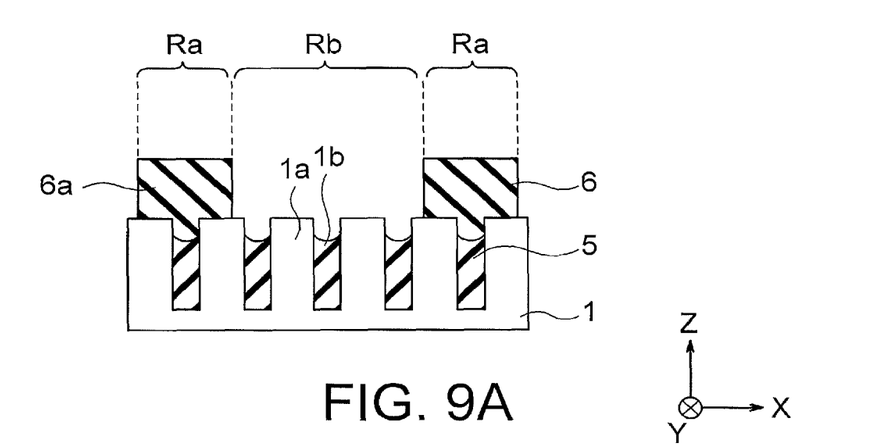

Next, the second photoresist film 6 is exposed to light from an exposure apparatus (FIG. 9A). In the present embodiment, the second photoresist film 6 in the second regions Rb is exposed to the light. Bake processing of the substrate 1 is then performed.

Next, the second photoresist film 6 is developed with a development liquid (FIG. 9A). By this means, the second photoresist film 6 in the second region Rb is dissolved and removed by the development liquid. As a result, second resist patterns 6a are formed of the second photoresist film 6 in the first regions Ra. The development liquid of the present embodiment is TMAH solution with concentration of 2.38%. The second resist patterns 6a are an example of the second pattern.

Figure 9B:
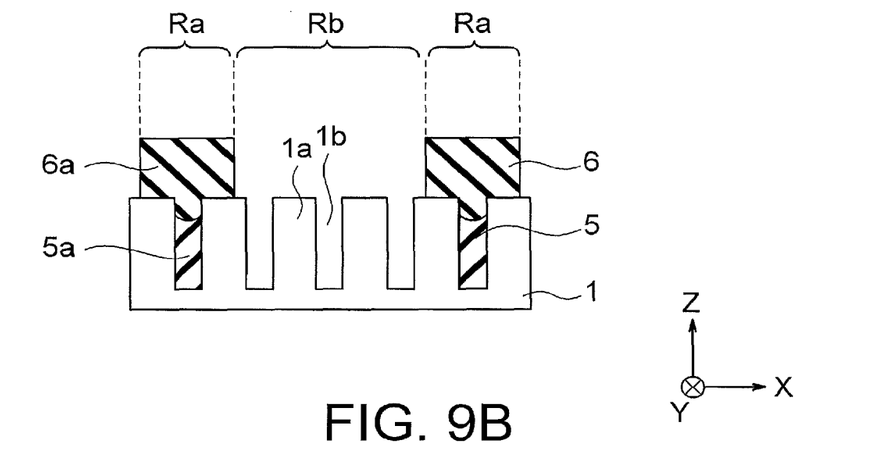

When the second photoresist film 6 in the second regions Rb is dissolved and removed, the first photoresist film 5 in the second regions Rb is exposed from the second photoresist film 6. As a result, the first photoresist film 5 in the second regions Rb is exposed to the development liquid. Since the photoresist film 5 of the present embodiment is water-soluble, it dissolves in the development liquid. Therefore, when the second photoresist film 6 in the second regions Rb is dissolved and removed by the development liquid, the first photoresist film 5 in the second regions Rb is dissolved and removed by this development liquid too (FIG. 9B). On the other hand, since the first photoresist film 5 in the first regions Ra is covered with the second resist patterns 6a, it is not exposed to the development liquid and is not dissolved and removed by the development liquid. As a result, first resist patterns 5a are formed of the first photoresist film 5 in the first regions Ra. The first resist patterns 5a are an example of the first pattern.

In this way, it is possible to form the first and second resist patterns 5a and 6a in which the concave portions 1b in the first regions Ra are covered and the concave portions 1b in the second regions Rb are exposed. For example, these patterns 5a and 6a can be used as a mask to implant ions into the substrate 1 at the bottoms of the concave portions 1b in the second regions Rb as well as the above-mentioned patterns 2a and 3a.

As mentioned above, the second photoresist film 6 in the present embodiment is formed on the substrate 1 through the first photoresist film 5. In the present embodiment, the second photoresist film 6 is exposed to the light, the second resist patterns 6a are formed by developing the second photoresist film 6, and the first resist patterns 5a are formed by dissolving and removing the first photoresist film 5. By this means, it becomes possible in the present embodiment to form the suitable patterns 5a and 6a on the substrate 1 that has the concave portions 1b. In the present embodiment, since both the first film and the second film are photoresist films, it is possible to form the first film and the second film in the same chamber.

In the exposure in FIG. 9A, the first photoresist film 5 may also be exposed together with the second photoresist film 6. In this case, it is desirable to assume the first photoresist film 5 to be a positive type if the second photoresist film 6 is the positive type. Moreover, it is desirable to assume the first photoresist film 5 to be a negative type if the second photoresist film 6 is the negative type. By this means, it becomes easier to dissolve and remove the first photoresist film 5 in the process in FIG. 9B.

Fourth Embodiment

Figure 10A:
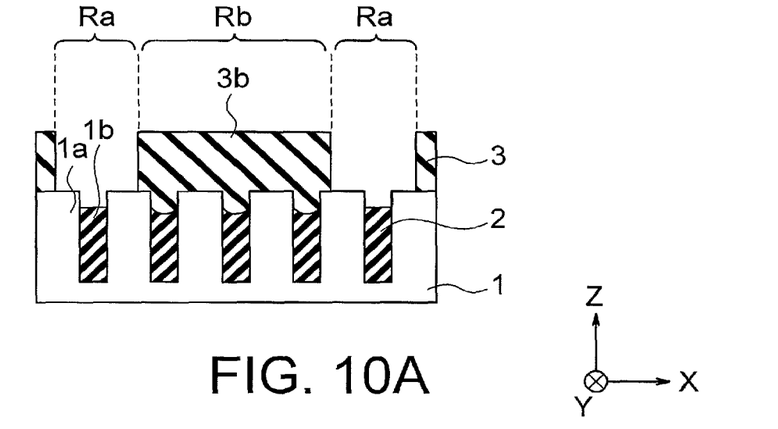
FIGS. 10A and 10B are a sectional view illustrating a pattern forming method of a fourth embodiment.
Figure 10B:
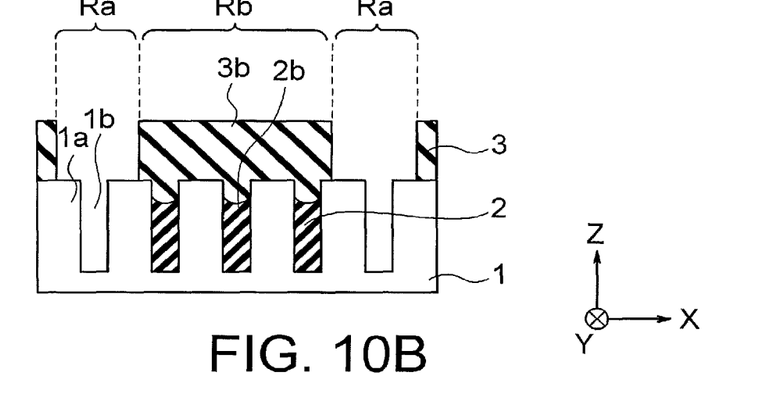

FIGS. 10A and 10B are sectional views illustrating a pattern forming method of a fourth embodiment. In the present embodiment, the photoresist film 3 of a negative type is used instead of the photoresist film 3 of a positive type. Therefore, the photoresist film 3 of unexposed portions is dissolved and removed instead of the photoresist film 3 of exposed portions.

First, the processes in FIGS. 1A to 1C are executed.

Next, the photoresist film 3 is exposed to light from the exposure apparatus (FIG. 10A). In the present embodiment, the photoresist film 3 in the second regions Rb is exposed to the light. Bake processing of the substrate 1 is then performed.

Next, the photoresist film 3 is developed with a development liquid (FIG. 10A). The photoresist film 3 of the present embodiment is a negative type. Therefore, the photoresist film 3 in the first regions Ra is dissolved and removed by the development liquid. As a result, resist patterns 3b are formed of the photoresist film 3 in the second regions Rb. The development liquid of the present embodiment is butyl acetate. The resist patterns 3b are an example of the second pattern.

When the photoresist film 3 in the first regions Ra is dissolved and removed, the coating film 2 in the first regions Ra is exposed from the photoresist film 3. As a result, the coating film 2 in the first regions Ra is exposed to the development liquid. However, the coating film 2 of the present embodiment does not dissolve in the butyl acetate.

Next, the substrate 1 is rinsed by using water (FIG. 10B). The water is an example of a liquid different from the development liquid. Since the coating film 2 of the present embodiment is water-soluble, it dissolves in the water. Therefore, the coating film 2 in the first regions Ra is dissolved and removed by the water. On the other hand, since the coating film 2 in the second regions Rb is covered with the resist patterns 3b, it is not exposed to the water and is not dissolved and removed by the water. As a result, coating film patterns 2b are formed of the coating film 2 in the second regions Rb. The coating film patterns 2b are an example of the first pattern.

In this way, it is possible to form the coating film patterns 2b and the resist patterns 3b in which the concave portions 1b in the second regions Rb are covered and the concave portions 1b in the first regions Ra are exposed. For example, these patterns 2b and 3b can be used as a mask to implant ions into the substrate 1 at the bottoms of the concave portions 1b in the first regions Ra.

The present embodiment makes it possible, similarly to the first embodiment, to form the suitable patterns 2b and 3b on the substrate 1 that has the concave portions 1b. The hydrophilization processing and the hydrophobization processing of the second embodiment may be applied to the pattern forming method of the present embodiment.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A pattern forming method comprising:
   forming a first film on a substrate that includes a convex portion and a concave portion so as to expose an upper end of the convex portion;
   forming a photosensitive second film on the first film so as to cover the upper end of the convex portion;
   exposing the second film to light;
   developing the second film with a development liquid to form a second pattern of the second film; and
   dissolving and removing the first film exposed from the second pattern with a liquid to form a first pattern of the first film.

2. The method of claim 1, wherein:
   the first film is formed by using a first coating liquid having a first viscosity; and
   the second film is formed by using a second coating liquid having a second viscosity higher than the first viscosity.

3. The method of claim 2, wherein the first viscosity is 4 cP or less.

4. The method of claim 3, wherein the first viscosity is 2 to 3 CP.

5. The method of claim 2, wherein the second viscosity is more than 4 CP.

6. The method of claim 5, wherein the second viscosity is 10 to 100 CP.

7. The method of claim 1, further comprising hydrophilizing a surface of the substrate before the first film is formed.

8. The method of claim 1, further comprising hydrophobizing surfaces of the substrate and the first film before the second film is formed.

9. The method of claim 1, wherein the first film is a water-soluble resin.

10. The method of claim 1, wherein the first film is non-photosensitive.

11. The method of claim 1, wherein the first film is photosensitive.

12. The method of claim 1, wherein the liquid for the dissolving and removing is the development liquid.

13. The method of claim 1, wherein the liquid for the dissolving and removing is a liquid different from the development liquid.

14. The method of claim 1, wherein the liquid different from the development liquid is water.

15. The method of claim 1, further comprising implanting ions into the substrate at a bottom of the concave portion by using the first and second patterns as a mask.

16. The method of claim 1, wherein the convex portion includes insulating layers and interconnect layers that are alternately provided, and includes a first insulator, a charge storing layer, a second insulator and a semiconductor layer provided on side surfaces of the insulating layers and the interconnect layers.

17. The method of claim 16, further comprising forming a first plug interconnect electrically connected with the substrate at a bottom of the concave portion.

18. The method of claim 17, further comprising forming a second plug interconnect electrically connected with the semiconductor layer.

19. A pattern forming method comprising:
   forming a first film on a substrate that includes a convex portion and first and second concave portions so as to expose an upper end of the convex portion;
   forming a photosensitive second film on the first film so as to cover the upper end of the convex portion;
   exposing the second film to light and developing the second film to form a second pattern of the second film;
   removing the first film exposed from the second pattern to form a first pattern of the first film;
   implanting first ions into the substrate at a bottom of the first concave portion by using the first and second patterns as a mask;
   forming a third film on the substrate so as to expose the upper end of the convex portion;
   forming a fourth photosensitive film on the third film so as to cover the upper end of the convex portion;
   exposing the fourth film to light and developing the fourth film to form a fourth pattern of the fourth film;
   removing the third film exposed from the fourth pattern to form a third pattern of the third film; and
   implanting second ions into the substrate at a bottom of the second concave portion by using the third and fourth patterns as a mask.

20. A pattern forming method comprising:
   preparing a substrate including a first region that includes first convex portions at a first density and a second region that includes second convex portions at a second density lower than the first density;
   forming a first film on the substrate so as to expose upper ends of the first and second convex portions;
   forming a photosensitive second film on the first film so as to cover the upper ends of the first and second convex portions;
   exposing the second film to light and developing the second film to form a second pattern of the second film; and
   removing the first film exposed from the second pattern to form a first pattern of the first film.

* * * * *